United States Patent [19]

Sorel

[11] Patent Number: 4,905,592
[45] Date of Patent: Mar. 6, 1990

[54] SCREEN-PRINTING MACHINE

[75] Inventor: Alain Sorel, Les Baux Ste Croix, France

[73] Assignee: U.S. Philips Corporation, New York, N.Y.

[21] Appl. No.: 312,510

[22] Filed: Feb. 17, 1989

[30] Foreign Application Priority Data

Feb. 19, 1988 [FR] France .................. 88 01989

[51] Int. Cl.$^4$ .............. B41L 13/02; B41L 13/18
[52] U.S. Cl. .................. 101/123; 101/127.1
[58] Field of Search ............ 101/127.1, 114, 123, 101/124, 126, 129, DIG. 47, 127

[56] References Cited

U.S. PATENT DOCUMENTS

| | | | |
|---|---|---|---|
| 3,650,208 | 3/1972 | Lambert | 101/123 |
| 4,193,344 | 3/1980 | Ericsson | 101/126 |
| 4,336,753 | 6/1982 | Vidalis | 101/127 |
| 4,537,126 | 8/1985 | Bubley | 101/123 |

Primary Examiner—Edgar S. Burr
Assistant Examiner—Joseph R. Keating

[57] ABSTRACT

The machine is used, for example, in the production of printed circuits.

The frame (5) supporting the screen cloth (3) is moved in a plane which always remains approximately parallel to the plane of the circuit (2) to be printed, and the machine is equipped, in each corner of the frame, with a tracer (9) which detects an exact height of the cloth (3) and which commands independently in each corner the stopping of the means (7, 8, 10, 17) for the lowering of the frame, so as to establish a reference height, on the basis of which fine adjustments can subsequently be programmed.

19 Claims, 3 Drawing Sheets

SCREEN-PRINTING MACHINE

DESCRIPTION

1. Background of the Invention

The invention relates to a screen-printing machine for printing a plane article, equipped with a mounting supporting the article, with a frame supporting a screen cloth, with means for moving this frame between a position set apart from the article for the loading/unloading of the latter and a working position, in which the cloth is virtually laid against the article, with a doctor movable above the cloth in a working position, and with means for moving the frame whilst at the same time keeping the latter in a plane always remaining approximately parallel to the plane of the article, which means consist of several raising/lowering mechanisms distributed along the periphery of the frame.

A machine according to the above preamble is known from the U.S. Pat. No. 4,336,753. This machine is equipped with a stationary mounting, on which an article to be inked is placed. The rectangular frame supporting the screen cloth is rigid, and it is equipped with raising/lowering mechanisms distributed along the periphery of the frame, in order, in the high position, to unload/load the machine and, in the low position, to carry out the actual screen printing. It is equipped with switches for stopping the actuation of the mechanisms when they reach their low position. This machine serves for dyeing fabrics, and therefore there is no need for high accuracy: consequently, it is not equipped with means for stopping the descent of the frame in an exact position; when it reaches the low position, the frame and the cloth are simply left laid on the article to be processed. Nevertheless, machines of this type are used especially in the electronic industry for the production of printed circuits. Much higher accuracy is then required, and this is all the more difficult to achieve because the machine has very large dimensions. There is also a special problem which is difficult to solve: when the cloth is in the working position, a small gap is necessary between it and the circuit to be inked, so that it does not adhere to the latter. A high degree of accuracy in the height of the frame relative to the article is therefore needed.

2. Brief Description of the Invention

The invention provides a machine which has very high accuracy with regard to the height of the frame, because the machine is equipped with a device for the exact detection of a particular position of the cloth, consisting of several height detectors, each arranged opposite the cloth in the vicinity of a raising/lowering mechanism, each of these detectors commanding the stopping of the adjacent mechanism when the latter has descended to the desired height.

The machine operates in the following way: with a circuit to be inked in place on the stationary mounting, the descent of the frame begins, and when the detection device ascertains that the cloth is in a reference position the descent stops. Thus, high accuracy is obtained as regards the height of the cloth above the circuit.

In an advantageous embodiment, there are four height-detector/lowering-mechanism assemblies, and these are each located near a corner of the frame.

Thus, during the descent, as soon as a corner of the frame has reached its reference height the descent stops for this corner and continues for the others, until they have each reached their exact height one by one, each of the four height detectors controlling the lowering mechanism located in the same corner as itself. By means of a tracer in each corner and the lowering process mentioned, the frame can to no disadvantage be deformable, particularly by skewing, and therefore its construction is lighter and more economical, the same being true of the raising/lowering mechanisms.

Once an exact height position has been obtained by means of these devices, it is possible to carry out a fine adjustment of the height of the assembly as a whole by a specific amount, without any loss of accuracy. The machines intended for printed circuits have a doctor which advances in order to scrape ink over the cloth. When the doctor presses on the cloth, the latter forms an angle, called a breakaway angle, with the circuit at the rear of the doctor, and this angle depends on the distance between the doctor and the edge of the frame; it is therefore difficult to ensure that the screen-printing parameters are constant over the entire surface of the circuit. With the machine according to the invention, it is possible to act in a suitable way on each of the corners of the frame, especially in order to adjust the breakaway angle. For this purpose, the raising/ lowering mechanisms are actuated according to programmable kinematics which are a function of the advance of the doctor, in order to adjust the breakaway angle of the cloth.

It becomes easier to obtain complex kinematics if the control is carried out by means of a programmable robot which contains in its memory the special settings for each type of screen printing and to which are sent the data supplied by the sensors of the machine, especially those from the tracers detecting the position of the cloth and the position of the doctor. When this robot is itself controlled by a computer, the possibilities for the storage of settings and flexibility of use are improved even further.

Because of the very high accuracy achieved by the machine according to the invention, there is no longer any need to provide elasticity in the region of the doctor, this elasticity being necessary in the prior art in order to compensate a lack of accuracy in the position of the frame, to which the doctor was fastened, and its disadvantage being that the scraping parameters were poorly defined. The machine according to the invention therefore ensures high-definition screen printing, because, the scraper being actuated by means of a sliding mechanism, the latter is fastened to the mounting, instead of being fastened to the frame, and because, during the movement of the doctor over the cloth, its height relative to the article is fixed, instead of being defined automatically under the effect of a spring or its own weight.

The high accuracy obtained with the above-described machine also affords a novel advantage. Whereas various expedients have for long been tried out in order to obtain the metallization of holes, for example by providing suction through the said holes in order to carry ink through them, with the present machine it is sufficient to ensure that the doctor, in its lower part, has an approximately plane surface inclined relative to the plane of the cloth, and that its direction of movement is such that the lowest part of the inclined plane is at the rear.

BRIEF DESCRIPTION OF THE DRAWINGS

The following description, with reference to the accompanying drawings describing non-limiting examples, will make it easy to understand how the invention can be put into practice.

FIG. 1 shows diagrammatically a mounting 1 carrying a plane circuit to be inked 2 and a cloth-carrying frame 5. A screencloth 3 is stretched and adhesively bonded under the frame 5.

DETAILED DESCRIPTION OF THE INVENTION

Figure 1:
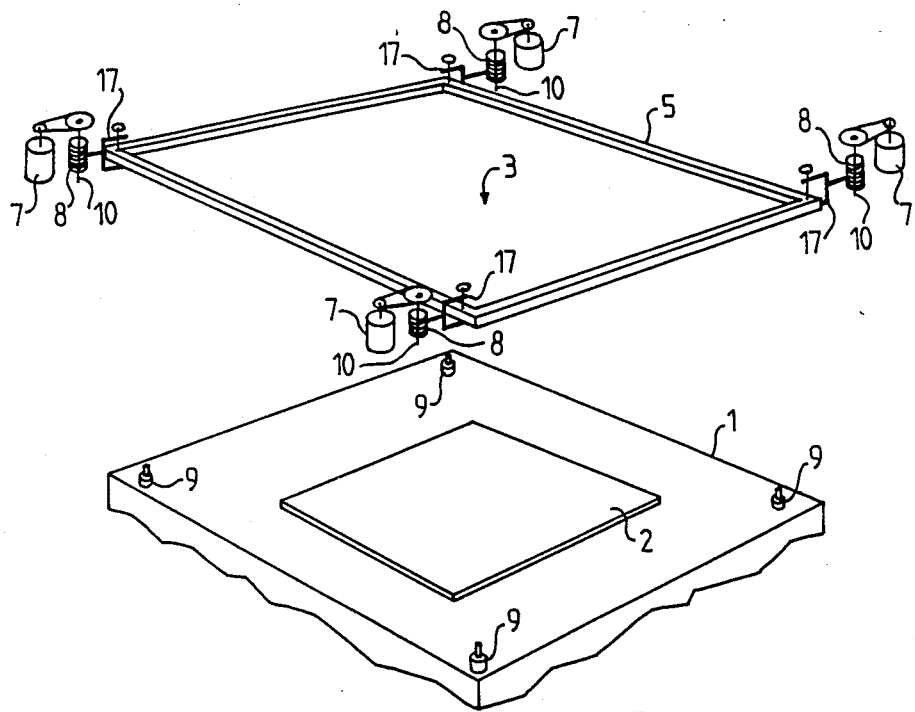
FIG. 1 is a diagrammatic perspective representation of the essential elements of a machine according to the invention.

Means are provided to ensure that the frame together with the cloth can be raised for the loading or unloading of the circuit 2 and lowered into a working position. These means consist of four vertical screws 10, the height position of which is fixed and which each drive a nut 8 fastened to the frame 5 by means of a gripper 17 near each of its four corners. These screws are each driven in rotation by means of a motor 7. The length of the screws 10 is intended to ensure that, in the low position, the cloth can touch the circuit 2 and, in the high position, the latter can easily be removed and another put in place. This machine can process, for example, printed circuits of a standard format of 65×53 cm. The difference in height between the loading/ unloading position and the working position is of the order of a few centimetres; the frame is shown here at some height above the mounting merely to give a clearer view of the various elements: in actual fact, it is located just above it, so that the cloth 3 can be pushed down onto the circuit 2 when it is lowered into its working position.

It is sufficient for the four motors 7 to rotate synchronously to ensure that the frame is moved, whilst at the safe time remaining parallel to the plane of the article, that is to say the circuit 2 and the mounting 1. As will be explained later, in fact small differences between the movements of the four motors are introduced deliberately.

The mounting 1 is equipped with four height detectors 9 which detect a particular position of the cloth accurately, namely the position in which the latter touches the four detectors simultaneously.

According to a preferred embodiment, these detectors each consist of an electrode, the upper end of which is located at an exact height. Since the cloth 3 is metallic or metallized (for example, a cloth made of metal-plated polyester available in the trade) and is connected to an electrical voltage, for example to earth, it makes a contact with the electrode when it touches it, thus making it possible to detect an electrical current. There can also be two electrodes at the same height for each detector, these two electrodes then being shortcircuited by the cloth. There can also be tracer-controlled switches, but the exact position of the tracer triggering the cutoff (or cut in) of the current is not always defined with great accuracy. It is also possible to use a pneumatic comparator based on the fact that the frame closes a port discharging air or an optical position-detecting system, of which there are many types.

Each of the detectors 9 is located near one of the corners of the frame, and the same is true of the raising/lowering systems 7, 8, 10, 17.

During the descent of the frame, as soon as one of the detectors 9 is actuated when that part of the frame opposite which it is located comes level with it, this detector commands the stopping of the corresponding motor. The stopping of the frame is therefore carried out in four stages, corner by corner. The frame can therefore be relatively simple and light, but is nevertheless positioned in a perfectly defined plane.

It would be possible to position the detectors 9 so as to stop the cloth at its working height, but this height is not constant, as will be explained later. Consequently, these detectors are placed just level with the upper face of the circuit 2. The frame is first lowered until the four contacts with the detectors are obtained and is thereafter moved a small amount easily controllable accurately, in order to bring it to the working height.

Each of the motors 7 is a direct-current motor with a coder, that is to say equipped with a device measuring its rotation and with a control which, on the basis of this measurement, makes it possible to command a rotational movement of a predetermined number of revolutions or fractions of a revolution. This makes it possible to obtain the desired working height from the position identified by the position detectors 9.

It would easily be possible to have other equivalent solutions, for example to use stepping motors or replace the screw/nut system 8, 10 by a lever/link system controlled by an endless screw actuated by the motor, provided that the amount of movement can be controlled reliably.

Figure 2:
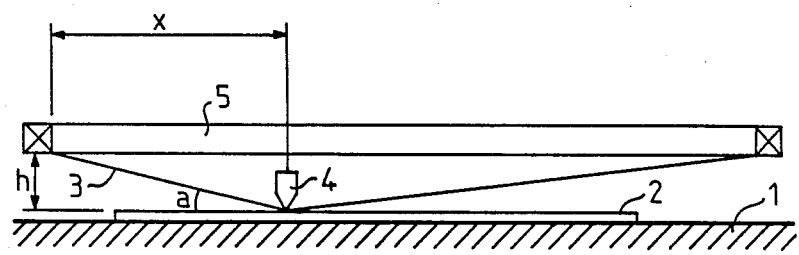
FIG. 2 is a basic diagram illustrating the definition of the breakaway angle.

FIG. 2 shows diagrammatically a rectangular frame, of which one side 5 and two sides perpendicular to the plane of the drawing, cut off and marked with an x can be seen. A cloth 3 is bonded adhesively to this frame. A mounting 1 supports a circuit to be inked 2. The frame is raised slightly relative to the circuit 2, and a doctor 4 lowers the cloth 3 by deforming it until it touches the circuit 2. The height of the frame is exaggerated in the drawing, in order to show the angle "a", called the breakaway angle, clearly. The tangent of this angle has the value h/x, where h is the left of the frame above the circuit and x is the distance between the left side of the frame and the doctor 4. When x varies, the angle "a" varies. To prevent this harmful effect, h must be varied at the same time as x.

With the system according to the invention, this variation is easily obtained by controlling the motors 7, naturally starting from the exact particular positioning of the cloth relative to the height detectors 9 which was first obtained. The motors are controlled in this way by means of a programmable robot which can also be connected to a computer and to which data indicating the position of the doctor 4 is sent. As a result of the programmed kinematics obtained in this way, an ideal angle "a" can easily be obtained for any position of the doctor. The control law employed can, for example, be that which keeps the ratio h/x constant. However, it is also possible to employ more complex laws, according to which the frame is inclined in such a way that the angle of the cloth relative to the circuit in front of the doctor (the equivalent of "a" on the other side of the doctor) is itself kept constant. The law of ideal variation depends on several parameters including the viscosity of the ink, the initial height of the doctor at the outset, the initial tension of the screen and the type of cloth. It must also be different, depending on whether a prior coating of the ink or the actual screen printing is being carried out.

Two raising/lowering mechanisms 7, 8, 10 located on the same line perpendicular to the advance of the doctor are then actuated in synchronism, in order to maintain the breakaway angle, whereas the four mechanisms were actuated independently of one another to obtain the initial positioning.

Figure 3A:
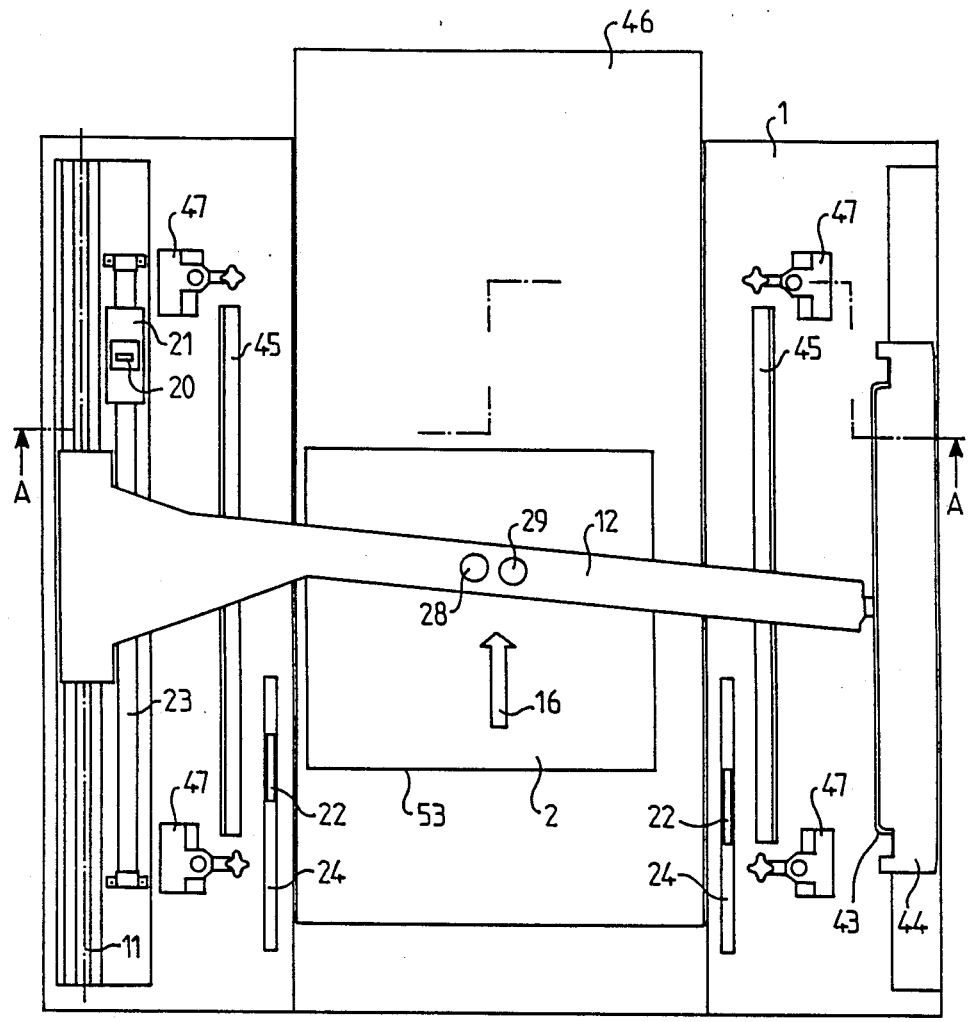
FIGS. 3A and 3B show the machine as a whole in a top view and an end view respectively.
Figure 3B:
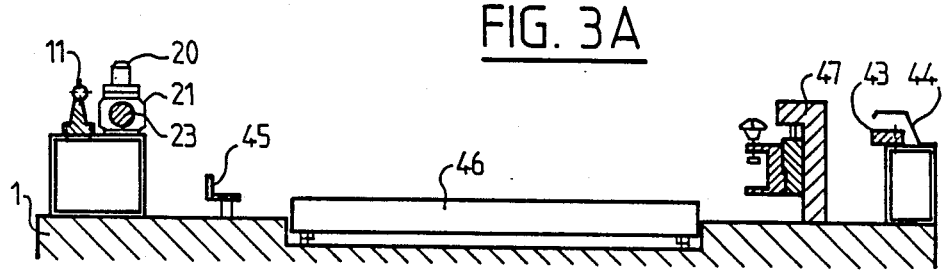
Figure 4:
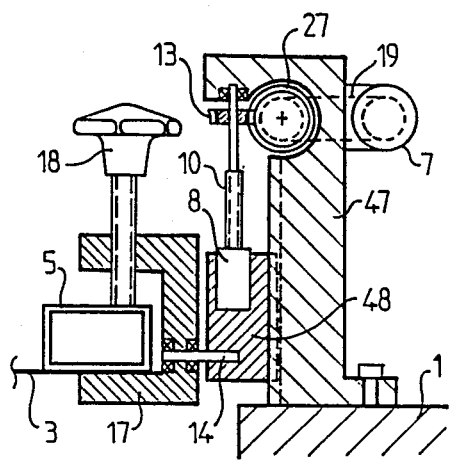
FIG. 4 shows a section through a lowering mechanism.
Figure 5:
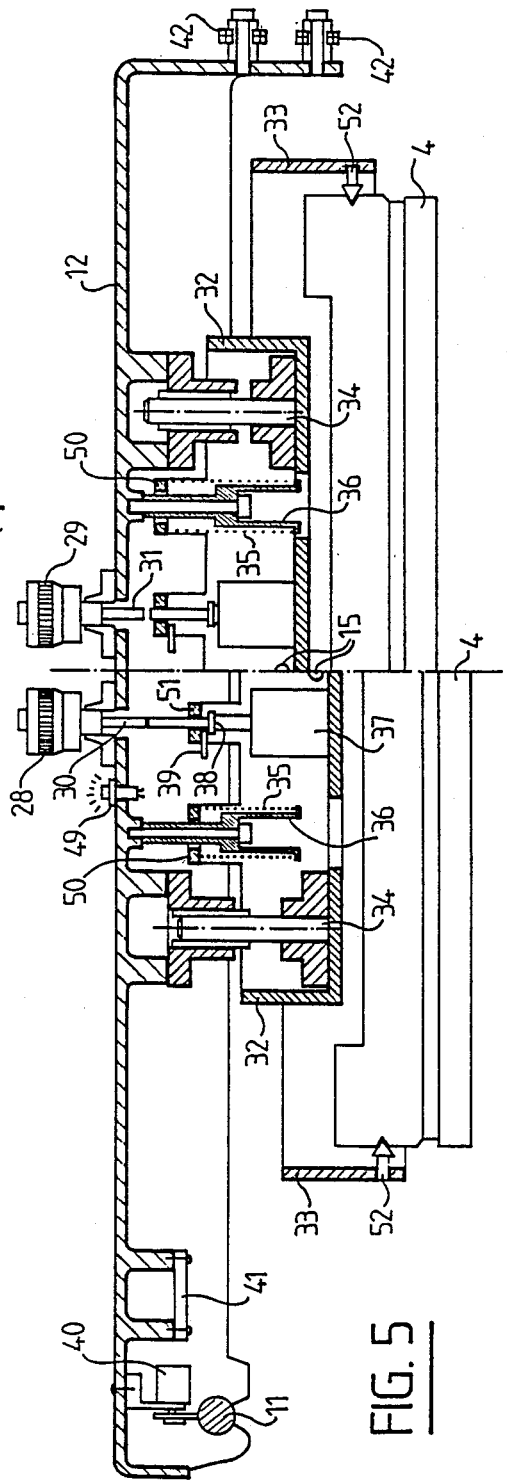
FIG. 5 shows a section through the mechanism for moving the doctor.

In FIGS. 3, 4 and 5, the members already mentioned above still bear the same references.

Fastened to the mounting 1 (FIG. 3A) is a sliding mechanism consisting of a horizontal tube 11, on which slides an arm 12 guiding the doctor. This arm moves parallel to the plane of the Figure in the direction indicated by the arrow 16.

It is actuated by means of a rodless jack, that is to say one formed by a piston actuated by oil inside a tube 23, this piston transmitting its movement magnetically to a sleeve 21 surrounding the tube 23. The tube 23 is placed parallel and next to the sliding support tube 11, and the arm 12 is attached to the sleeve 21 by means of a finger 20. In the Figure, the arm 12 is shown to one side, to make it possible to see the sleeve 21; it is clear that, during operation, this arm 12 driven by the finger 20 is located above it. The arm, at its other end, on the right in the Figure, is guided by a bar 43 protected by a housing 44. The speed of moment can be adjusted by regulating the flow of oil in the jack 23. Devices for measuring the speed and position of the arm are provided. Starting from the position, the robot controls the motors raising the frame in order to adjust the breakaway angle.

The mounting 1 carries a slide 46, shown highly diagrammatically, which makes it possible to deliver and remove the printed circuit to be inked.

When an operator slides the frame 5 (not shown to make the Figure clearer) into place, two brackets 45 support it temporarily, until it is attached to the four raising/ lowering devices 47.

The position of all these elements (except the arm 12) is also illustrated in the end view of FIG. 3B which is a section taken along the line AA of FIG. 3A.

A raising/lowering mechanism is shown in more detail and in section in FIG. 4. A column 47 carries the motor 7. A piece 48 slides vertically on this column and is integral with the nut 8, in which the threaded rod 10 is screwed. The latter is driven in rotation by means of an assembly consisting of a gearwheel 13 and of an endless screw 27. The latter is driven from the motor 7 by means of a belt 19. A stirrup 17 is fastened to the piece 48 by means of an axle 14. The axle 14 allows the stirrup to pivot when the frame is inclined, in order to adjust the breakaway angle.

A screw with a knurled knob 18 makes it possible to lock the frame 5 in the stirrup 17.

The arm 12 is shown in more detail and in section in FIG. 5. It comprises a main body 12, an intermediate piece 32 and a doctor-supporting piece 33.

The main body 12 slides on the tube 11 (perpendicular to the plane of the drawing) and at the other end is guided by two ball castors 42 which roll on either side of the bar 43 of FIG. 3B. A plate 41 is coupled to the finger 20 (FIG. 3B) of the hydraulic jack in order to drive the arm. A measuring element 40 fastened to the body 12 is equipped with a wheel which rolls on the tube 11 in order to measure the speed of movement of the arm and its position. This makes it possible to regulate the speed which must differ according to the type of screen printing. The position is transmitted to the robot for the purpose of controlling the breakaway angle.

The intermediate piece 32 is shown in a low position in its half on the left in the drawing and in the higher position in its half on the right. It carries two vertical axles 34 which slide in ball sleeves fastened to the body 12. The piece 32 is therefore guided in terms of vertical translational motion relative to the body 12.

Two springs 35, each bearing their lower end on a piece 36 attached to the body 12 and at their upper end on a stay 50 connected to the piece 32, push the intermediate piece 32 upwards. In opposition to these springs, a rodded jack 37 is fastened to the intermediate piece 32. Its rod passes through a stay 51 connected to the intermediate piece 32 and bears on the rod 30 of a micrometer stop 28, in order to cause the intermediate piece 32 to descend. Another identical jack bears on the rod 31 of a micrometer stop 29. Only one of these two jacks is used at a time, and they are located sufficiently near the centre for the action of only one of the two not to cantilever the piece 32.

The rod of the jack carries a collar 38 which touches an electrical contact element 39 carried by the stay 51, when it reaches the end of its stroke. This contact demands the stopping of the jack and also the ignition of an indicator lamp 49.

The doctor 4 is mounted pivotably about centre punches 52 fastened to the doctor-supporting piece 33 which is attached solely at its centre to the intermediate piece 32 by means of an axle 15 parallel to the plane of the printed circuit and perpendicular to the doctor. This axle allows the pivoting of the piece 33 and therefore of the doctor 4.

The special arrangement of the jack 37 makes it possible to adjust the doctor height easily by the following procedure: with a circuit and a cloth in the working position, the assembly consisting of the pieces 32 and 33 is lowered until it reaches the extreme low position, that is to say until the collar 38 touches the contact 39 and the lamp 49 lights up. It is assumed that the doctor 4 then still does not touch the cloth. The knob of the micrometer stop 28 is then rotated by hand until it bears on the rod of the jack 37 and causes the assembly to descend. When it comes in contact with the cloth supported by the printed circuit, it can no longer continue to descend. The rod of the jack 37 then begins to retract into the jack and the collar 38 leaves the contact 39, thus extinguishing the lamp. It is then known that the reference position, in which the doctor is pressed against the cloth, has been reached. From this position, a differential variation adjustable, as desired, by means of the graduations of the micrometer stop can be made. For this entire process, a greatly reduced oil pressure is used in the jack 37, to avoid risking damaging the cloth.

One of the two jack/micrometer-stop pairs is used for the coating of the other for the actual screen printing.

Figure 6:
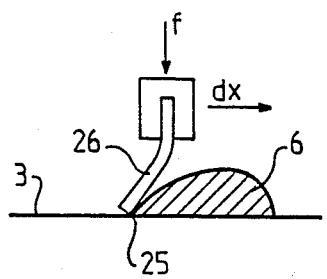
FIG. 6 shows a section through a doctor of the prior art.

The doctors of the prior art (FIG. 6), because there was no relative accuracy between the frame and the mounting, were fastened to the frame and pressed downwards with a specific force f and were equipped with an elastic scraping part 26 acting a little like the bristles of a paint brush in order to push the pile of ink 6 over the cloth 3 (to the right in the Figure). It was therefore impossible to fix the exact position of the scraping edge 25, and the screen-printing parameters were not controlled very effectively.

On the contrary, the high accuracy of positioning of the frame relative to the mounting of the machine according to the invention allows the doctor 4 to be fastened at a set height above the mounting. The doctor is rigid per se, thus ensuring an exact definition of the vertical position of the bearing line of the doctor on the cloth. The lower part of the doctor 4 is made of hard rubber.

The tilting of the doctor, with the scraping edge set back rearwards relative to its directional advance, is possible because of the fastening by means of the centre punches 52 of FIG. 5. Jacks (not shown) fastened to the part 33 keep the doctor 4 vertical, whilst at the same time allowing a possible escape by tilting, should the doctor encounter an unexpected obstacle. However, this possibility is provided purely for safety reasons, but does not perform any function during normal operation.

The doctor 4 is arranged obliquely relative to its direction of movement 16, because the arm 12 (FIG. 3) is not completely perpendicular to the tube 11. It forms an angle of approximately 5° with the perpendicular to the tube 11.

In the oblique position, the doctor makes it easier for the latter to pass over the edge 53 of the printed circuit (FIG. 3A), at the moment when the doctor reaches it, during its movement from its initial position (not shown) at the bottom of FIG. 3A.

Because of this oblique position, during the movement in the direction 16, the left end of the doctor reaches the edge 53 first, thus risking causing a tilting of the doctor. To prevent this, sole pieces 22 movable in the vertical direction are positioned in the mounting, so as to support the doctor when it is no longer above the circuit 2, the upper face of these sole pieces being at the same height as the circuit.

Similar sole pieces (not shown) are also arranged along the opposite edge of the circuit 2, where the doctor leaves the circuit. The sole pieces 22 come out above the mounting through elongate orifices 24, thus allowing horizontal sliding which makes it possible to adapt to different circuit dimensions.

The vertical positioning of the sole pieces 22 is obtained by means of a weak spring and an electrical or pneumatic brake which locks the sole piece. When the cloth has descended against the circuit, the sole piece 22 is allowed to rise and takes up a position pressed against the cloth 3 under the effect of the spring, then being locked in this position by means of the break. Instead of pressing the sole piece against the cloth, a rule can also be placed on the circuit 2, this rule projecting beyond the circuit above the sole pieces and being removed after the locking of the break.

Different degrees of automation can be considered: in response to the reading of a component type code, the robot assisted by a computer can, for example, store a "know how" which comprises: the speed of advance of the arm for coating and that for scraping, the screen height, approximately fifteen points on the screen-recording curve, between which it calculates an interpolation, for adjusting the breakaway angle, and even the doctor height for scraping and coating, if the manual micrometer stops 28, 29 are replaced by coder-type motor stops.

The operator need only put the circuit in place on the slide 46, after a few initial operations, such as the installation of the screen, the mounting of a doctor of suitable hardness and the adjustment of the position of the sole pieces 22.

The slide 46 makes it possible to load/unload the circuit, the frame 5 being raised only a few centimetres. It would also be possible to use conveyor belts which would pass over the mounting and which would be retracted into grooves during the screen printing.

Figure 7:
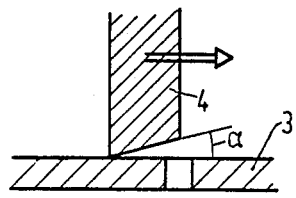
FIG. 7 shows a section through a doctor intended for making metallised holes.

To obtain the metallisation of holes, the doctor, in its lower part, has an approximately plane surface inclined relative to the plane of the cloth, and its direction of movement is such that the lowest part of the inclined plane is at the rear. Thus, during the advance of the doctor, the ink is pushed downwards into the holes. This is illustrated in FIG. 7, where the doctor 4 moves in the direction of the arrow and its lower cross-section is an inclined plane forming an angle $\alpha$ with the cloth 3. Of course, the angle $\alpha$ and the speed of horizontal movement of the doctor must be adjusted according to the geometry of the articles. For example, with a circuit of a thickness of 0.8 mm, holes of a diameter of 0.6 mm and an ink of a viscosity of 100 centipoises, an angle $\alpha$ of 13° and a doctor speed of 14 cm/sec gives the best results. With a thickness of 1.6 mm and holes of a diameter of 0.8 mm, an angle of 10° is preferable, with the same speed. The same doctor is used in the opposite direction of movement for carrying out the coating.

I claim:

1. A screen-printing machine for printing a plane article, comprising mounting means for supporting the article;

a screen cloth;

a frame supporting the screen cloth;

means for moving the frame between a loading/unloading position spaced from the article for the loading/unloading of the article and a working position, in which the cloth is disposed adjacent to the article;

a doctor movable above the screen cloth in the working position;

means for moving the frame toward and away from the article in a plane approximately parallel to the plane of the article, said means for moving the frame comprising a plurality of raising/lowering mechanisms coupled to the frame;

means for sensing a predetermined position of the screen cloth, said means for sensing height comprising a plurality of detectors, each arranged opposite the screen cloth in the vicinity of one of said raising/lowering mechanisms; and means for enabling each of said detectors to command the stopping of the adjacent mechanism when the screen cloth has descended to the desired height.

2. A machine according to claim 1, in which the frame is rectangular, and there are four height-detector/lowering mechanism assemblies, one located near each corner of the frame.

3. A machine according to claim 1, comprising means for adjusting the angle at which said screen cloth breaks contact with the article after the doctor has passed, said means including programmable kinematics which are a function of the advance of the doctor.

4. A machine according to claim 3, in which the raising/lowering mechanisms are controlled by a programmable robot.

5. A machine according to claim 4, in which the robot is controlled by a computer.

6. A machine according to any of claims 1 through 5; comprising a direct-current motor with a coder for actuating each of the raising/lowering mechanisms.

7. A machine according to claim 6, comprising a sliding mechanism, fastened to the mounting, for moving the doctor over the cloth, and maintaining its bearing height on the cloth fixed relative to the mounting.

8. A machine according to claim 7, used for the screen printing of electrically conductive tracks on a printed circuit, in which the doctor, in its lower part, has an approximately plane surface inclined relative to the plane of the cloth, and its direction of movement is such that the lowest part of the inclined plane is at the rear.

9. A machine according to claim 7, in which the doctor is fastened solely at its centre, and is pivotable about an axis parallel to the plane of the article and approximately perpendicular to the doctor.

10. A machine according to claim 9, in which the doctor is arranged obliquely relative to the perpendicular to its direction of movement, and sole pieces movable in the vertical direction are positioned so as to support the doctor when it is no longer above the article, the upper face of these sole pieces being at the same height as the article.

11. A machine according to claim 1, in which the frame is rectangular, and there are four height-detector/lowering mechanism assemblies, one located near each corner of the frame.

12. A machine according to claims 11 through 16, comprising a direct-current motor with a coder for actuating each of the raising/lowering means.

13. A machine according to claim 12, comprising a sliding mechanism, fastened to the mounting, for moving the doctor over the cloth, and maintaining its bearing height on the cloth fixed relative to the mounting.

14. A machine according to claim 13 used for the screen printing of electrically conductive tracks on a printed circuit, in which the doctor, in its lower part, has an approximately plane surface inclined relative to the plane of the cloth, and its direction of movement is such that the lowest part of the inclined plane is at the rear.

15. A machine according to claim 13, in which the doctor is fastened solely at its centre, and is pivotable about an axis parallel to the plane of the article and approximately perpendicular to the doctor.

16. A machine according to claim 15, in which the doctor is arranged obliquely relative to the perpendicular to its direction of movement, and sole pieces movable in the vertical direction are positioned so as to support the doctor when it is no longer above the article, said sole pieces each having an upper face at the same height as the article.

17. A machine according to claim 1, comprising means for adjusting the angle at which said screen cloth breaks contact with the article after the doctor has passed said means including programmable kinematics which are a function of the advance of the doctor.

18. A machine according to claim 1, in which the raising/lowering means are controlled by a programmable robot.

19. A machine according to claim 18, in which the robot is controlled by a computer.

* * * * *